United States Patent [19]  
Maurer et al.

[11] 3,991,373  
[45] Nov. 9, 1976

[54] INPUT CIRCUIT FOR A MICROWAVE RECEIVING SYSTEM
[75] Inventors: Robert Maurer, Laatzen; Karl-Heinz Löcherer, Langenhagen, both of Germany
[73] Assignee: Licentia Patent-Verwaltungs-G.m.b.H., Frankfurt am Main, Germany
[22] Filed: June 22, 1973
[21] Appl. No.: 372,581

[30] Foreign Application Priority Data
June 22, 1972 Germany............................ 2230536

[52] U.S. Cl. ................................ 325/485; 330/4.9
[51] Int. Cl.² ........................................ H04B 1/16
[58] Field of Search ............... 325/4, 365, 371, 485; 307/88.3; 330/4.5, 4.9; 321/69 R

[56] References Cited
UNITED STATES PATENTS

| | | | |
|---|---|---|---|
| 3,118,113 | 1/1964 | Ferrar et al. ..................... | 325/485 |
| 3,237,017 | 2/1966 | Maurer et al. ................... | 325/434 |
| 3,320,432 | 5/1967 | Rosa ................................. | 307/88.3 |
| 3,334,299 | 8/1967 | Holzwarth ........................ | 325/485 |
| 3,353,099 | 11/1967 | Hayasi et al. ................... | 325/485 X |
| 3,562,657 | 2/1971 | Locherer et al. ................ | 333/4.5 X |
| 3,710,255 | 1/1973 | Gicca ............................... | 325/4 |
| 3,784,916 | 1/1974 | Maurer ............................ | 325/485 X |

OTHER PUBLICATIONS
Sie et al; "Noise Figure of Receiver Systems Using Parametric Amplifiers" 1959 –IRE Convention – pp. 141–157.
Ross et al.; "Parametric Frequency Convertors with Arbitrary Pumping Angles" Proceedings of IEEE, June 1962, pp. 239–240.
Parametric and Tunnel Diodes, K. Chang, Prentice-Hall EE Series 1964.
"Unidirectional Lower Sideband Parametric Amplifier Without Circulator" G. Thompson, Proc. of IRE, Nov. 1961, p. 1684.
"Parametric Frequency Convertors with Arbitrary Pumping Angles", Ross and Skalnik, Jan. 1963, Proceedings of IEEE, pp. 239–240.
"Low Noise Nonreciprocal Parametric Amplifier with Power Matching at the Input and Output", Maurer and Locherer, Proc. of IEEE, Nov. 1963, p. 1589.
Transistor Circuits, edited by R.F. Shea, c. 1957, pp. 290–299; pp. 332–334.

*Primary Examiner*—Robert L. Griffin
*Assistant Examiner*—Aristotelis M. Psitos
*Attorney, Agent, or Firm*—Spencer & Kaye

[57] ABSTRACT

An input circuit for use in a microwave receiving system. The input circuit includes an antenna for receiving the microwave signals and a parametric down converter, which operates in a lower side-band frequency position. The parametric down converter includes a mixing diode, a pump circuit, an input signal circuit and an output circuit. The input signal circuit of the parametric down converter is directly connected to the antenna so that the input signal circuit of the parametric down converter is terminated by the real portion of the antenna impedance. The impedance of the antenna is selected so that for $p \gg z$ (where p is the pump frequency and z is the intermediate frequency) the impedances of the antenna at the signal frequency $p + z$ and at the reflective frequency $p - z$ approach the same value.

12 Claims, 10 Drawing Figures

INPUT CIRCUIT FOR A MICROWAVE RECEIVING SYSTEM

BACKGROUND OF THE INVENTION

The present invention pertains to an input circuit for a microwave receiving system.

It is known to utilize a parametric down converter in an input circuit of a receiving system, with the parametric down converter being indirectly coupled to the antenna receiving the microwave signals. The parametric down converter provides a signal, or forward, circuit path which passes the received signals and a reflective circuit in which a reflective signal returns from the remaining portion of the receiving system. The parametric down converter is generally coupled to the antenna via a circulator which blocks the reflected signal from returning to the antenna.

SUMMARY OF THE INVENTION

An object of the present invention is to provide an improved input circuit for a microwave receiving system.

Another object of the present invention is to provide an input circuit for a microwave receiving system in which the noise in the circuit is maintained at an extremely low level without the need for extra complex circuitry.

These objectives can be accomplished by constructing the input circuit of the microwave receiving system in accordance with the present invention. The input circuit includes a parametric down converter which has its input signal circuit directly connected to the antenna so that the reflective circuit path of the parametric down converter is terminated by the real portion of the antenna impedance. The impedance of the antenna is selected so that for $p >> z$ (where $p$ is the pump frequency and $z$ is the intermediate frequency) the impedances of the antenna at the signal frequency $p + z$ and at the reflective frequency $p - z$ approach the same value.

This parametric down converter includes, in addition to the input signal circuit which is connected to the antenna, a reactance diode, a pump circuit and an output circuit. The pump circuit provides a pump frequency $p$ which is tuned to the carrier frequency of the signal received by the antenna for processing the signals received by the antenna. The output circuit is connected to further amplifying stages of the receiving system.

If a parallel type parametric down converter is utilized in the input circuit then the reflective circuit is terminated by the real portion of the antenna conductance. In such an arrangement the parameters of the parametric down converter and the antenna are selected such that for $p >> z$ $$a = \frac{p-z}{p+z} \cdot \frac{G_{p+z} + G_D}{G_{p-z} + G_D} \to 1 \quad (1)$$

where $G_{p+z}$ is the signal frequency circuit conductance (which equals the antenna conductance at the signal frequency $p + z$), $G_{p-z}$ is the reflective frequency circuit conductance (which equals the antenna conductance at the reflective frequency $p - z$)

and $G_D$ is the conductance loss of the reactance diode.

If a series type parametric down converter is utilized, however, then the reflective circuit is terminated by the real portion of the antenna resistance. The parameters of the parametric down converter and the antenna in this arrangement are selected such that for $p >> z$ $$a = \frac{p+z}{p-z} \cdot \frac{R_{p+z} + R_D}{R_{p-z} + R_D} \to 1 \quad (2)$$

where $R_{p+z}$ is the signal frequency circuit resistance (which equals the antenna resistance at the signal frequency $p + z$), $R_{p-z}$ is the reflective frequency circuit resistance (which equals the antenna resistance at the reflective frequency $p - z$)

and $R_D$ is the resistance loss of the reactance diode.

The output circuit of both the parallel type and the series type parametric down converter is coupled to an IF amplifier. The parameters of the IF amplifier, in accordance with the present invention, should be selected such that $$\frac{G_E}{G_{S,min}} = \frac{R_E}{R_{S,min}} = \frac{1+a}{1-a} \quad (3)$$

where $G_E$ and $R_E$ is the input conductance and resistance, respectively, of the IF amplifier and $G_{S,min}$ and $R_{S,min}$ is the conductance and resistance, respectively, of the signal source of the IF amplifier for a minimum noise condition. There are several different types of amplifier circuits which can be used for such an IF amplifier for use with the parallel type and series type parametric down converters, such as for example: a tube in a grid-base configuration or in a cathode-base configuration; a transistor connected in a common base configuration or in a common emitter configuration; a field effect transistor connected in a common gate configuration or a common source configuration; and a mixer chain amplifier of either the series or parallel type, respectively.

Furthermore, it is possible to construct the input circuit by an integrated circuit process. The input circuit of the present invention is especially advantageous for use in a satellite receiving system.

DESCRIPTION OF THE PREFERRED EMBODIMENTS

Figure 1:
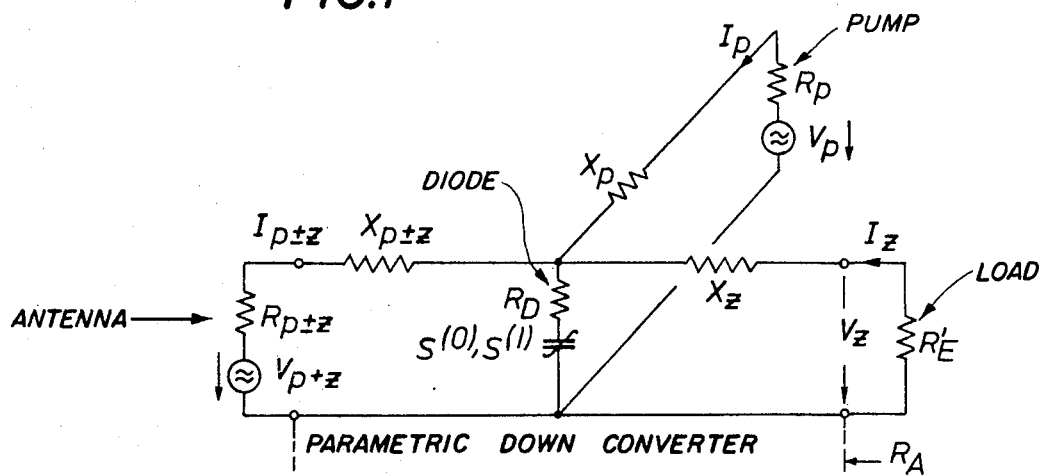
FIG. 1 shows an equivalent circuit diagram of an input circuit for a microwave receiving system with a parametric down converter of the series type in accordance with the present invention.

In the equivalent circuit of the input circuit of the present invention as shown in FIG. 1, the antenna is effectively represented by the signal source $V_{p+z}$ and the resistance $R_{p \pm z}$. The reactance of the initial section of the input circuit is represented by $X_{p \pm z}$ and the current through the antenna by $I_{p \pm z}$. In the preceding elements $p + z$ is the signal frequency and $p - z$ is the reflective or mirror frequency.

The signal coming from the antenna can then be processed by a parametric down converter of the series type, which is directly connected to the antenna, as shown in FIG. 1. The parametric down converter mixes the signal from the antenna with the pump frequency $p$ in order to effectively demodulate the incoming signal. The pump frequency is generated by the pump circuit which includes a source $V_p$, a resistance $R_p$ and a reactance $X_p$ and which has a current $I_p$. This pump frequency $p$ is mixed with the incoming signal in the reactance diode, $S^{(0)}$, $S^{(1)}$, which has a resistance $R_D$. The signal after being processed by the parametric down converter is now at an intermediate frequency of $z$. The parameters of this parametric down converter and the impedance of the antenna are selected so as to satisfy equation (2).

The output section of the parametric down converter, which is coupled to the subsequent amplifier stages, provides a reactance $X_z$ and a voltage $V_z$ and current $I_z$. The output resistance of the parametric down converter is $R_A$. The subsequent amplifier stage, which can be a dual and noise-matched IF amplifier as will be described in greater detail below, has an input resistance $R'_E$.

Figure 2:
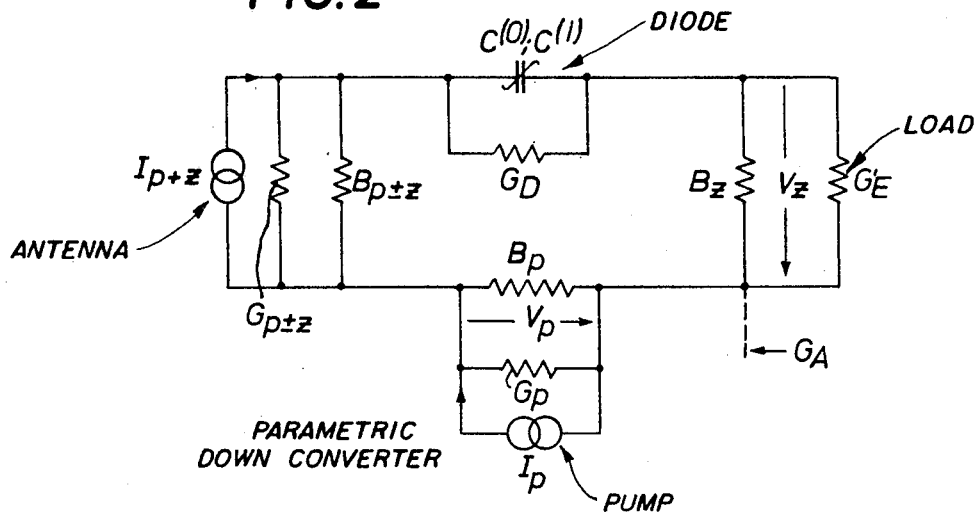
FIG. 2 shows an equivalent circuit diagram of an input circuit for a microwave receiving system with a parametric down converter of the parallel type in accordance with the present invention.

If in place of the series type parametric down converter which is represented in FIG. 1, a parallel type parametric down converter is utilized then the equivalent circuit would be as shown in FIG. 2. In this arrangement, the signal received by the antenna is represented by the current source $I_{p+z}$ and the antenna has a conductance of $G_{p \pm z}$ and a susceptance of $B_z$. The parallel type parametric down converter provides a current $I_p$ at the pump frequency $p$ and the pump circuit has a conductance $G_p$ and a susceptance $B_p$. The parameters of this parametric down converter and the impedance of the antenna are selected so as to satisfy equation (1). The signal from the antenna and from the pump circuit are mixed in the reactance diode $C^{(0)}$, $C^{(1)}$, which has a conductance $G_D$. The output circuit of the parametric down converter has a susceptance $B_z$ and provides a signal $V_z$ to the subsequent amplifier stages, which have an input conductance $G'_E$. The output conductance of the parametric down converter is $G_A$.

In the circuits shown in FIGS. 1 and 2, with equations (1) and (2) from above, it can be seen that at low diode losses, i.e. $R_D \rightarrow O$ or $G_D \rightarrow O$, the conversion gain of the mixer $L_{vm}$ is $$L_{vm} = \frac{z}{p+z} \cdot \frac{1}{1-a} \qquad (4)$$

and the noise temperature $T_m$ is $$T_m = \frac{p+z}{p-z} a\, T_{sp} \qquad (5)$$

where $T_{sp}$ is the temperature of the reflective circuit. From equations (4) and (5), it consequently can be seen that for $a \rightarrow 1$ and $p >> z$, so that the signal frequency and reflective frequency are effectively synchronized, a very high conversion gain is available and the noise temperature is in the vicinity of the temperature of the reflective circuit.

Figure 3:
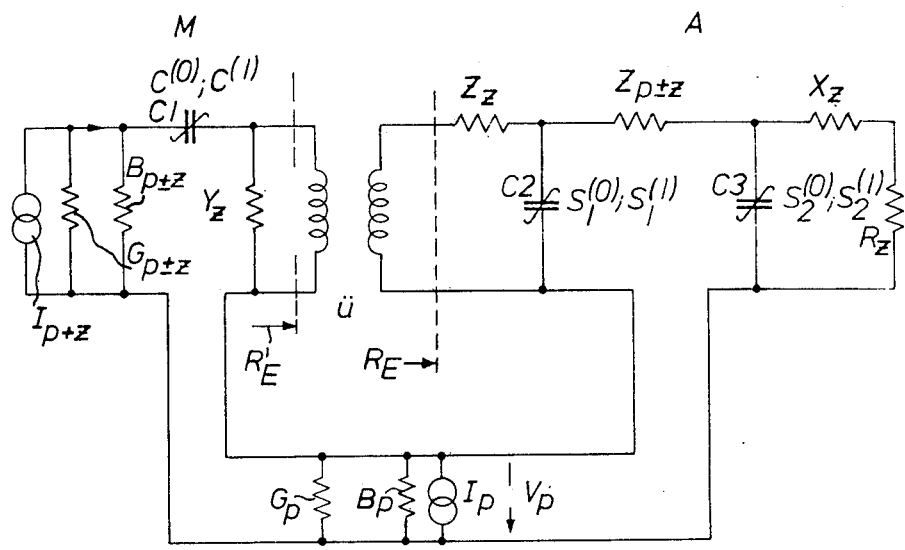
FIG. 3 shows an equivalent circuit diagram of an input circuit for a microwave receiving system with a parametric down converter of the parallel type and mixer chain amplifier of the series type forming the IF amplifier.
Figure 4:
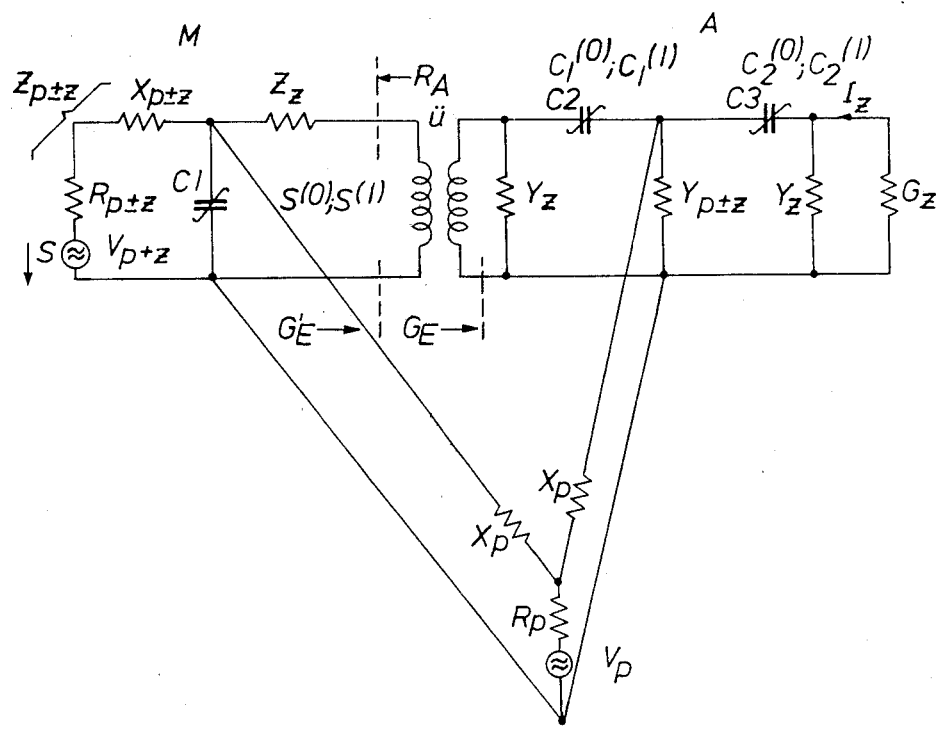
FIG. 4 shows an equivalent circuit diagram of an input circuit for a microwave receiving system with a parametric down converter of the series type and a mixer chain amplifier of the parallel type forming the IF amplifier.

In a further embodiment of the present invention, a suitable IF amplifier A is connected as the amplifier stage in series with the output circuit of the parametric down converter M, as shown in FIGS. 3 and 4. With such an arrangement it is possible to obtain a low noise input circuit by noise matching of the IF amplifier so that its noise temperature is brought to its minimum value $(T_{IF})_{min}$. For this purpose, the following condition must be met:

$$R_A = R_{S,min}\, ü^2 \text{ or } G_A = G_{S,min}\, /ü^2 \qquad (6)$$

where $R_{S,min}$ or $G_{S,min}$ is the input resistance or conductance of the IF amplifier for minimum noise and $ü$ is the transforming ratio of the transformer between the parametric down converter and the IF amplifier.

According to the Friis equation, this input circuit then has the noise temperature of $$T_{ges} = T_m + \frac{(T_{IF})_{min}}{L_{vm}} \qquad (7)$$

see Blackwell and Kotzebue, "Semiconductor-Diode Parametric Amplifiers", Prentice-Hall EE Series 1961, page 21 equation 2.28 for $g = L_v$. From the above equations, it can be seen that for $p >> z$ and the conditions of equations (1) and (2) and according to (4) and (5) the noise temperature of the input circuit $$T_{ges} \quad T_{sp} \qquad (8)$$

In accordance with the present invention, it is possible to simultaneously obtain noise matching for the IF amplifier and power matching at the input circuit of the parametric down converter. For such purposes, a series type mixer chain can be utilized for the IF amplifier with a parallel type parametric down converter, as shown in FIG. 3, or a parallel type mixer chain can be utilized for the IF amplifier with a series type parametric down converter, as shown in FIG. 4.

When the parallel type parametric down converter is selected then the series type IF amplifier must meet the condition:

$$\frac{R_E}{R_{S,min}} = \frac{1-a}{1+a} \quad (9)$$

where $R_E = R'_E u^2$
and $R_E$ is the input resistance of the IF amplifier.

A series type of IF amplifier satisfying this condition can be obtained by using a parametric mixer chain amplifier of the series type, such as shown in FIG. 3. Such an amplifier includes a chain connection of a parametric up converter and a parametric down converter whose diodes are pumped by a common pump oscillator at the same frequency with a phase difference between the oscillations. This type of mixer chain is described for example in the U.S. Pat. No. 3,711,780 issued Jan. 16, 1973, to R. Maurer. The pump oscillator for the amplifier can be the same pump oscillator as that utilized in the parametric down converter connected to the antenna.

Alternatively, other types of amplifiers could be utilized for the IF amplifier with the parallel type parametric down converter in place of the mixer chain in accordance with the present invention, as long as the parameters of the circuit are selected so that the condition of equation (9) is satisfied. Such an amplifier can be realized where the active element is, for example, any of the following: a tube connected in a grid-base connection; a transistor connected in a base configuration; or a field effect transistor connected in a gate configuration.

Figure 5:
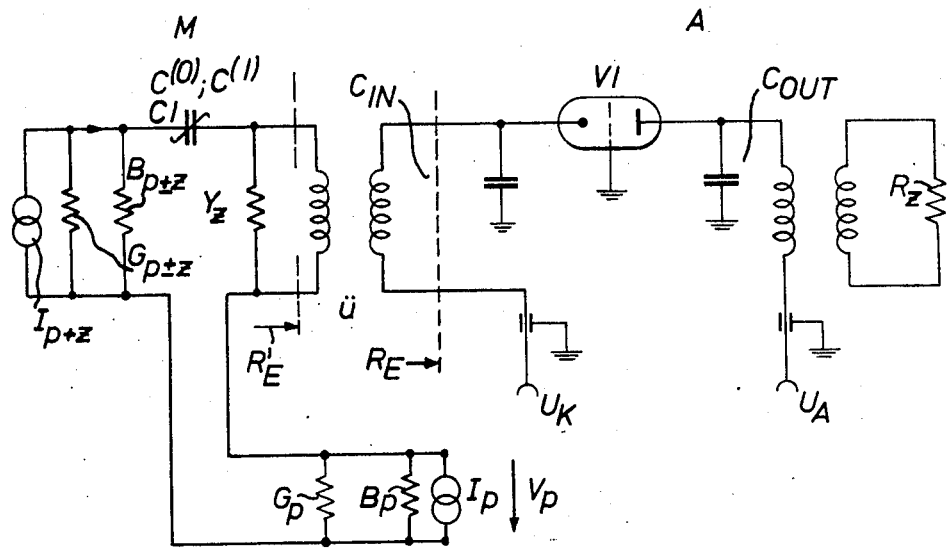
FIG. 5 shows an equivalent circuit diagram as in FIG. 3 where the amplifier A consists of a tube connected in a grid-base configuration.

If the shown amplifier A of FIG. 3 is replaced by a tube stage in grid-base configuration this leads to the circuit shown in FIG. 5. The tube V1 has an input circuit $c_{in}$ and an output circuit $c_{out}$ and a voltage supply is connected to these circuits at $+U_K$ and $+U_A$, respectively.

Figure 6:
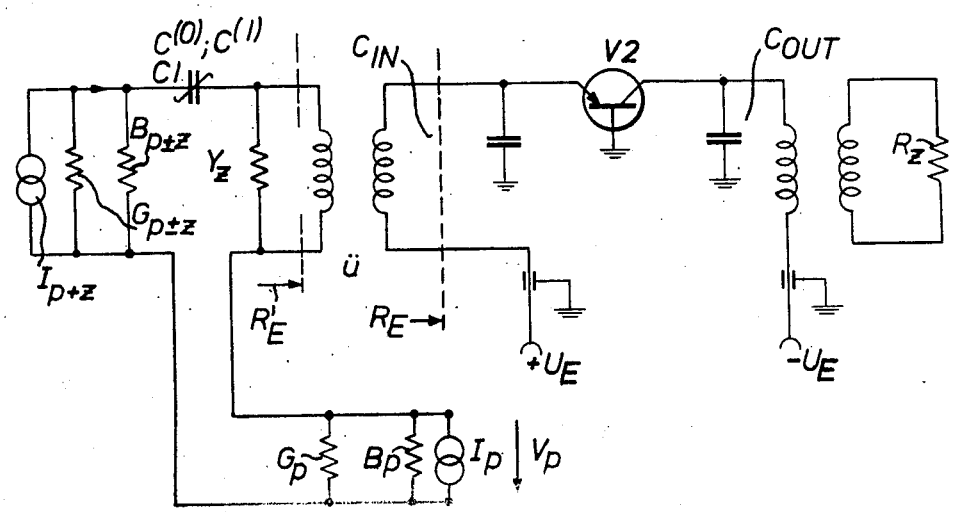
FIG. 6 shows an equivalent circuit diagram as in FIG. 5, but the tube amplifier is replaced by a transistor stage connected in common-base configuration.

FIG. 6 shows an equivalent circuit similar to FIG. 5 but the tube is replaced by a transistor V2 connected in common-base configuration with the input circuit $c_{in}$ and the output circuit $c_{out}$. The necessary voltage for the stage is fed in at $+U_E$ and $-U_E$, respectively. The transistor utilized in this embodiment is of the pnp-type.

Figure 7:
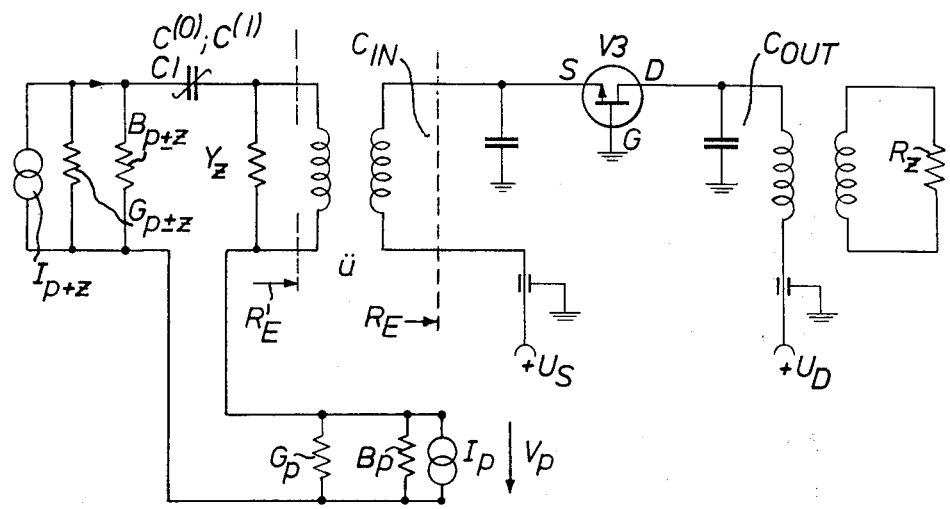
FIG. 7 shows an equivalent circuit diagram similar to FIG. 6 where the amplifier stage is built up by a field effect transistor connected in a common-gate configuration.

Another modification is shown in FIG. 7. The active element in this embodiment is a field transistor V3 of the N-channel-type which is connected in a common-gate configuration.

Figure 8:
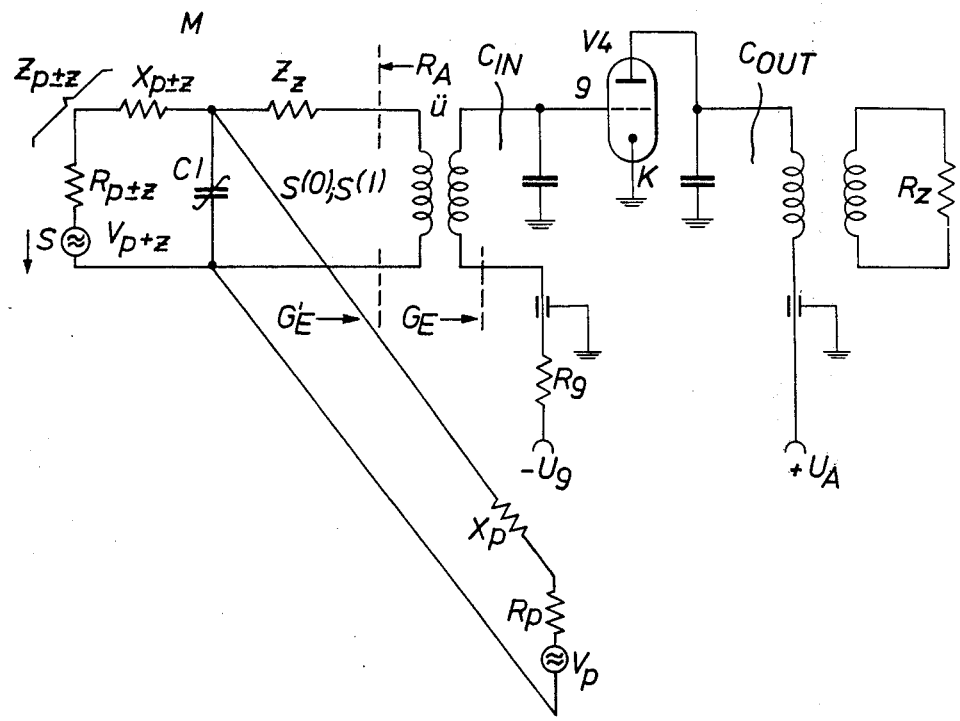
FIG. 8 shows an equivalent circuit as in FIG. 4 where the amplifier A is built by a tube stage connected in cathode-base configuration.

FIG. 8 shows an equivalent circuit similar to FIG. 4 where the amplifier A is built up by a tube V4 connected in a cathode-base configuration.

Figures 9, 10:
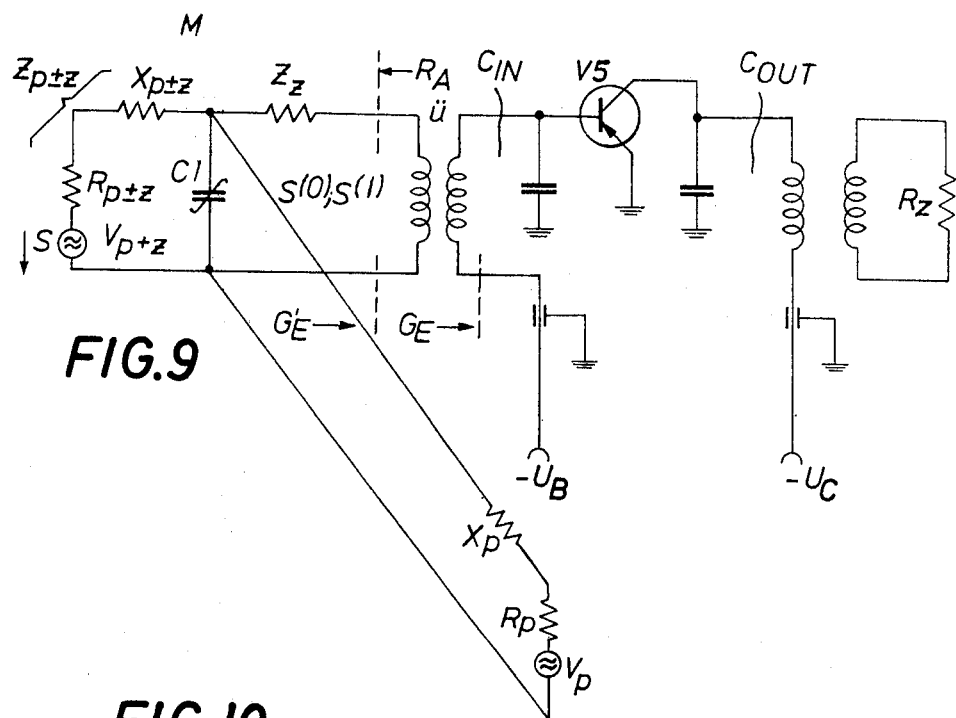
FIG. 9 shows an equivalent circuit similar to FIG. 8 where the amplifier is a transistor connected in a common-emitter configuration.
FIG. 10 shows an equivalent circuit similar to FIG. 9 with an IF amplifier built up by a field effect transistor connected in a common-source configuration.

In the circuit of FIG. 9, a transistor V5 connected in a common-emitter configuration is the active element for the amplifier A.

Still another modification of the invention is shown in FIG. 10. The active element of the amplifier is built by a N-channel-type field effect transistor V6 connected in common-source configuration. The transistor V6 has an input circuit $c_{in}$ and an output circuit $c_{out}$ and a supply voltage is fed in at $-U_G$ and $+U_D$, respectively.

If, however, a series type parametric down converter is utilized then the IF amplifier must meet the condition $$\frac{G_E}{G_{S,min}} = \frac{1-a}{1+a} \quad (10)$$

where $G_E = 1/u^2 \cdot G'_E$ and $G_E$ is the input conductance of the IF amplifier.

One particularly advantageous embodiment of an IF amplifier which satisfies this condition is a parametric mixer chain amplifier of the parallel type, as shown in FIG. 4. Such an amplifier is especially advantageous since it is nonreciprocal and provides extremely good decoupling between the input and output in that the feedback admittance is suitably neutralized, as described, for example, in U.S. Pat. No. 3,237,017. By utilizing a parallel type mixer chain amplifier with the series type parametric down converter the desired power matching is obtained.

Alternatively, other types of amplifiers can be utilized for the IF amplifier with the series type parametric down converter in place of the mixer chain amplifier in accordance with the present invention, as long as the parameters of the circuit are selected so that the condition of equation (10) is satisfied. Such an amplifier can be realized where the active element is, for example, any of the following: a tube connected in a cathode-base connection; a transistor connected in a common emitter configuration; or a field effect transistor connected in a common source configuration.

The operation of the input circuit of the microwave receiver according to the present invention will now be described with respect to the arrangement shown in FIG. 4.

The parametric down converter in the illustrated embodiment is a mixer M of the series type which has a mixing diode C1, which conventionally is a reactance diode.

The complex resistance of the signal circuit is $Z_{p+z}$ where $p+z$ is the signal frequency. The complex resistance of the output circuit of the parametric down converter at the intermediate frequency $z$ is $Z_z$. The reflective circuit has an operating frequency of $p-z$ and provides a complex resistance of $Z_{p-z}$. Under the condition that the pump circuit frequency $p$ is substantially higher than the intermediate frequency $z$, the two frequencies $p+z$ and $p-z$ are relatively close together. Then the antenna resistance $R_{p+z}$, which is at the antenna temperature $T_A$, can simultaneously be used to attenuate the signals in both the signal circuit and the reflective circuit, i.e. $R_{p-z} \approx R_{p+z}$ or $G_{p-z} \approx G_{p+z}$ and $T_{sp} = T_A$. Under such conditions, the conditions of equations (2) and (3), for the respective circuit arrangements, are also satisfied.

Furthermore, in accordance with equation (8) the following applies for this circuit $$T_{ges} = T_{sp} = T_A \quad 11.$$

and $$F_{ex} = \frac{T_{ues}}{T_0} = \frac{T_A}{T_0} \text{ with } \begin{cases} \frac{R_{p+z}}{R_{p-z}} \to \frac{p-z}{p+z} \\ \text{or} \\ \frac{G_{p+z}}{G_{p-z}} \to \frac{p+z}{p-z} \end{cases} \quad (12)$$

($F_{ex}$ = excess noise figure; $T_0 = 290°$ K).

Accordingly, $F_{ex} = 1$ for $T_A = T_0$, but $F_{ex} < 1$ for $T_A < T_0$; the latter is the case for satellite ground stations. It is well known that the noise temperature of the receiver input stage should be of the same order of magnitude of the antenna noise temperature. For satellite ground stations the noise temperature of their microwave antennas with an elevation angle between 0° and 70° is e.g. in the range between 2° and 10° K (see figure 2.9 page 27 Kotzebue).

The microwave antenna to which the parametric down converter M is connected is shown in FIG. 4 by the signal source S. The parametric down converter M which is of the series type in the drawing is connected to a mixer chain amplifier A of the parallel type. The two reactance diodes of the mixer chain amplifier A are C2 and C3. At both the input and output sides the IF amplifier has a parallel resonant circuit tuned to the intermediate frequency $z$ with the complex resistance $Y_z$. The two reactance diodes C2 and C3 are coupled together via a common auxiliary circuit which is shown by $Y_{p \pm z}$. The coupling of the IF amplifier A to the parametric down converter M is effected by a transformer with the transformer ratio $ü^2$. The parametric down converter has an output resistance $R_A$ and the IF amplifier A has an input conductance $G_E$. Under the given conditions in such an input circuit, with power matching at the input and output and additionally a higher power amplification, noise temperatures which lie in the vicinity of the noise temperature of the connected antenna can be produced. If the system is a satellite receiving system, the antenna is directed toward the satellite and has a noise temperature, at 4GHz, for example of about 50° C. The input circuit of the receiving system according to the present invention then has approximately the same noise temperature without it being necessary to cool the circuit.

It will be understood that the above description of the present invention is susceptible to various modifications, changes and adaptations, and the same are intended to be comprehended within the meaning and range of equivalents of the appended claims.

We claim:
1. In an input circuit for a microwave receiving system having an antenna for receiving microwave signals and a parametric down converter operating in a lower side-band frequency position, the parametric down converter including a mixing diode, a pump circuit, an input signal circuit and an output circuit, the improvement wherein said input signal circuit of said parametric down converter is directly connected to said antenna and is terminated by the real portion of the antenna conductance, said parametric down converter is a parallel type converter, and said parametric down converter satisfies the following relationship for $p >> z$

$$a = \frac{p-z}{p+z} \cdot \frac{G_{p+z} + G_D}{G_{p-z} + G_D} \rightarrow 1$$

where
$p$ is the pump frequency,
$z$ is the intermediate frequency,
$p + z$ is the signal frequency,
$p - z$ is the reflective frequency,
$G_{p+z}$ is the signal frequency circuit conductance and is equal to the antenna conductance at the signal frequency $p + z$,
$G_{p-z}$ is the reflective frequency circuit conductance and is equal to the antenna conductance at the reflective frequency $p - z$, and $G_D$ is the conductance loss of the mixing diode; and further comprising a noise-matched IF amplifier having its input coupled to the output circuit of said parametric down converter, said IF amplifier satisfying the following relationship $$\frac{R_E}{R_{S,min}} = \frac{1-a}{1+a}$$

where
$R_E$ is the input resistance of said IF amplifier and
$R_{S,min}$ is the resistance of the signal source of said IF amplifier for minimum noise.

2. An arrangement as defined in claim 1 wherein said IF amplifier includes a tube connected in a grid-base configuration.

3. An arrangement as defined in claim 1 wherein said IF amplifier includes a transistor connected in a common base configuration.

4. An arrangement as defined in claim 1 wherein said IF amplifier includes a field effect transistor connected in a common gate configuration.

5. An arrangement as defined in claim 1 wherein said IF amplifier is a mixer chain amplifier of the series type which includes a parametric up converter in series with a parametric down converter.

6. An arrangement as defined in claim 5 wherein said pump circuit of said parametric down converter is a pump oscillator and said pump oscillator also serves as a pump source for said mixer chain amplifier.

7. In an input circuit for a microwave receiving system having an antenna for receiving microwave signals and a parametric down converter operating in a lower side-band frequency position, the parametric down converter including a mixing diode, a pump circuit, an input signal circuit and an output circuit, the improvement wherein said input signal circuit of said parametric down converter is directly connected to said antenna and is terminated by the real portion of the antenna resistance, said parametric down converter is a series type converter, and said parametric down converter satisfies the following relationship for $p >> z$ $$a = \frac{p+z}{p-z} \cdot \frac{R_{p+z} + R_D}{R_{p-z} + R_D} \rightarrow 1$$

where
$p$ is the pump frequency,
$z$ is the intermediate frequency,
$p + z$ is the signal frequency,
$p - z$ is the reflective frequency,
$R_{p+z}$ is the signal frequency circuit resistance and is equal to the antenna resistance at the signal frequency $p + z$,
$R_{p-z}$ is the reflective frequency circuit resistance and is equal to the antenna resistance of the reflective frequency $p - z$, and
$R_D$ is the resistance loss of the mixing diode; and further comprising a noise-matched IF amplifier having its input coupled to the output circuit of said parametric down converter, said IF amplifier satisfying the following relationship $$\frac{G_E}{G_{S,min}} = \frac{1-a}{1+a}$$

where $G_E$ is the input conductance of said IF amplifier and $G_{S,min}$ is the conductance of the signal source of said IF amplifier for minimum noise.

8. An arrangement as defined in claim 7 wherein said IF amplifier includes a tube connected in a cathode-base configuration.

9. An arrangement as defined in claim 7 wherein said IF amplifier includes a transistor connected in a common emitter configuration.

10. An arrangement as defined in claim 7 wherein said IF amplifier includes a field effect transistor connected in a common source configuration.

11. An arrangement as defined in claim 7 wherein said IF amplifier is a mixer chain amplifier of the parallel type which includes a parametric up converter in parallel with a parametric down converter.

12. An arrangement as defined in claim 11 wherein said pump circuit of said parametric down converter is a pump oscillator and said pump oscillator also serves as a pump source for said mixer chain amplifier.

* * * * *